(12) United States Patent
Yoo (10) Patent No.: US 7,576,554 B2
(45) Date of Patent: Aug. 18, 2009

(54) SEMICONDUCTOR DEVICES AND METHODS OF TESTING THE SAME

(75) Inventor: Hong-Bom Yoo, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 664 days.

(21) Appl. No.: 11/412,528

(22) Filed: Apr. 27, 2006

(65) Prior Publication Data

US 2006/0267623 A1    Nov. 30, 2006

(30) Foreign Application Priority Data

May 30, 2005    (KR) ............... 10-2005-0045662

(51) Int. Cl.
    *G01R 31/26* (2006.01)
(52) U.S. Cl. .................. 324/765; 324/763; 714/738
(58) Field of Classification Search ............... None
    See application file for complete search history.

(56) References Cited

U.S. PATENT DOCUMENTS 6,163,867 A * 12/2000 Miller et al. ............... 714/736

FOREIGN PATENT DOCUMENTS

| JP | 2000-046919 | 2/2000 |
|----|-------------|--------|
| JP | 2003-287563 | 10/2003 |
| KR | 2000-0005741 | 1/2000 |
| KR | 2001-0058519 | 7/2001 |

* cited by examiner

*Primary Examiner*—Minh N Tang
(74) *Attorney, Agent, or Firm*—Myers Bigel Sibley & Sajovec, P.A.

(57) ABSTRACT

A semiconductor device may include a plurality of output electrodes configured to provide electrical coupling for a respective plurality of output signals outside the semiconductor device. A signal generator may be configured to generate the plurality of output signals. In addition, a test circuit may be coupled between the signal generator and the plurality of output electrodes. The test circuit may be configured to couple each of the output signals to a respective one of the output electrodes in a first operating mode, and the test circuit may be configured to sequentially couple each one of the output signals to one of the output electrodes in a second operating mode. Related methods are also discussed.

20 Claims, 6 Drawing Sheets

FIG. 6

SEMICONDUCTOR DEVICES AND METHODS OF TESTING THE SAME

RELATED APPLICATION

This application claims the benefit of priority from Korean Patent Application No. 2005-0045662 filed on May 30, 2005, the disclosure of which is hereby incorporated herein by reference in its entirety.

FIELD OF THE INVENTION

The present invention relates to semiconductor devices, and more particularly to methods of testing semiconductor devices and related devices.

BACKGROUND

In general, liquid crystal display (LCD) devices may provide advantages, such as improved screen definition, light weight, thin construction, and/or low power consumption when compared with cathode ray tube (CRT) display devices. Use of LCD devices is thus increasing relative to CRT display devices, and LCD devices are being used in mobile systems such as notebook computers, mobile communication terminals, television sets, computer systems, and various other applications.

Typically, these LCD devices may include an LCD panel, a driver used to drive the LCD panel, a timing controller, and other components. Furthermore, the driver may be configured as a chip to be more easily built-in within the LCD device, and the chip may be referred to as a display driver integrated circuit (DDI).

The driver of the LCD may be classified as a source driver used to apply data signals to display a picture to a plurality of data lines formed in the LCD panel, a gate driver used to apply drive signals to sequentially scan gate lines of the LCD panel, etc.

The gate driver may perform a function of sequentially supplying turn-on voltages of switching transistors through the gate lines so that the picture data provided from the source driver may be provided to each of the pixels formed at the intersections of the gate lines and source lines of the LCD panel.

Figure 1:
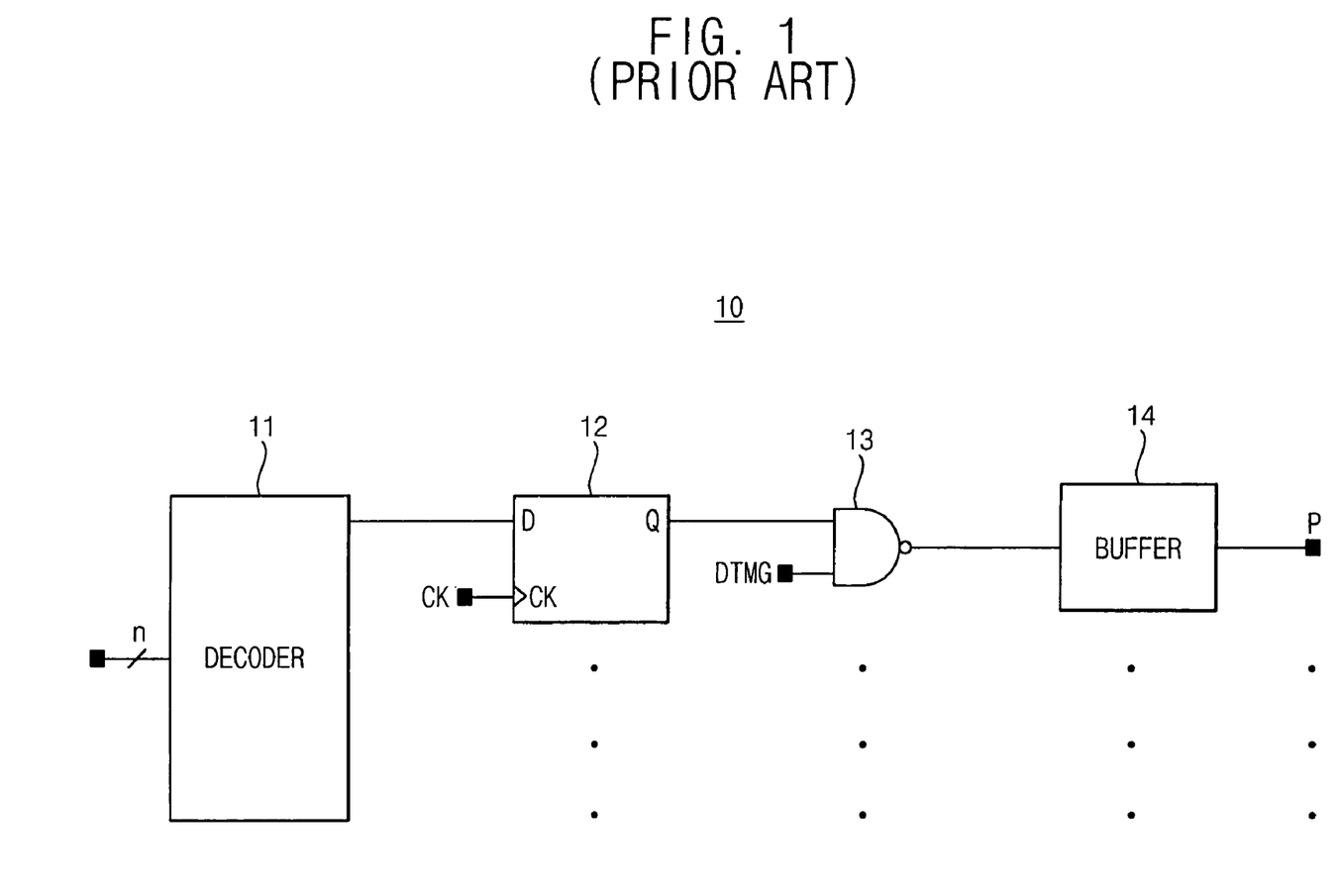
FIG. 1 is a circuit diagram illustrating a conventional gate driver.

FIG. 1 is a circuit diagram illustrating a conventional gate driver. Referring to FIG. 1, a conventional gate driver 10 may include a decoder 11 used to decode data provided from an exterior timing controller to output a decoded signal, a plurality of D-type flip-flops 12 used to receive each of the decoded signals output from the decoder 11 to generate output signals according to a divided clock CK applied from the exterior, and a plurality of buffers 14 used to buffer the output signals from the D-type flip-flops 12 to apply the final gate voltage through output pins P to the gate lines. In addition, a NAND gate 13 may be coupled between the D-type flip-flops 12 and the buffers 14.

As illustrated in FIG. 1, the data signal supplied from the exterior may be an n-bit data signal. Therefore, the number of the signals decoded by the decoder may be $2^n$, and the number of the D-type flip-flops and the buffers may be $2^n$. Accordingly, each of $2^n$ gate voltage signals may be output through each of $2^n$ output pins P in response to the input n-bit data signal.

As LCD panels have been gradually increasing in size, a number of output pins of the semiconductor devices including the driver integrated circuit (IC) used to drive the LCD panel have been increasing.

Accordingly, providing adequate quality is an increasingly important issue in the semiconductor devices, and research on test techniques for the semiconductor devices has been in progress. Improved test processes may be needed because errors that may occur in the driver IC may be very closely related to defects of the LCD.

To test such a driver IC, each test terminal of automatic test equipment (ATE) may be connected to a respective output pin of the driver IC so that the driver IC may be measured to determine whether the output signals from the driver IC are normal or abnormal. This conventional method using the ATE, however, may have a problem in that test terminals and test channels of the ATE may need to be provided in equal or greater number than the output pins of the driver IC.

Figure 2:
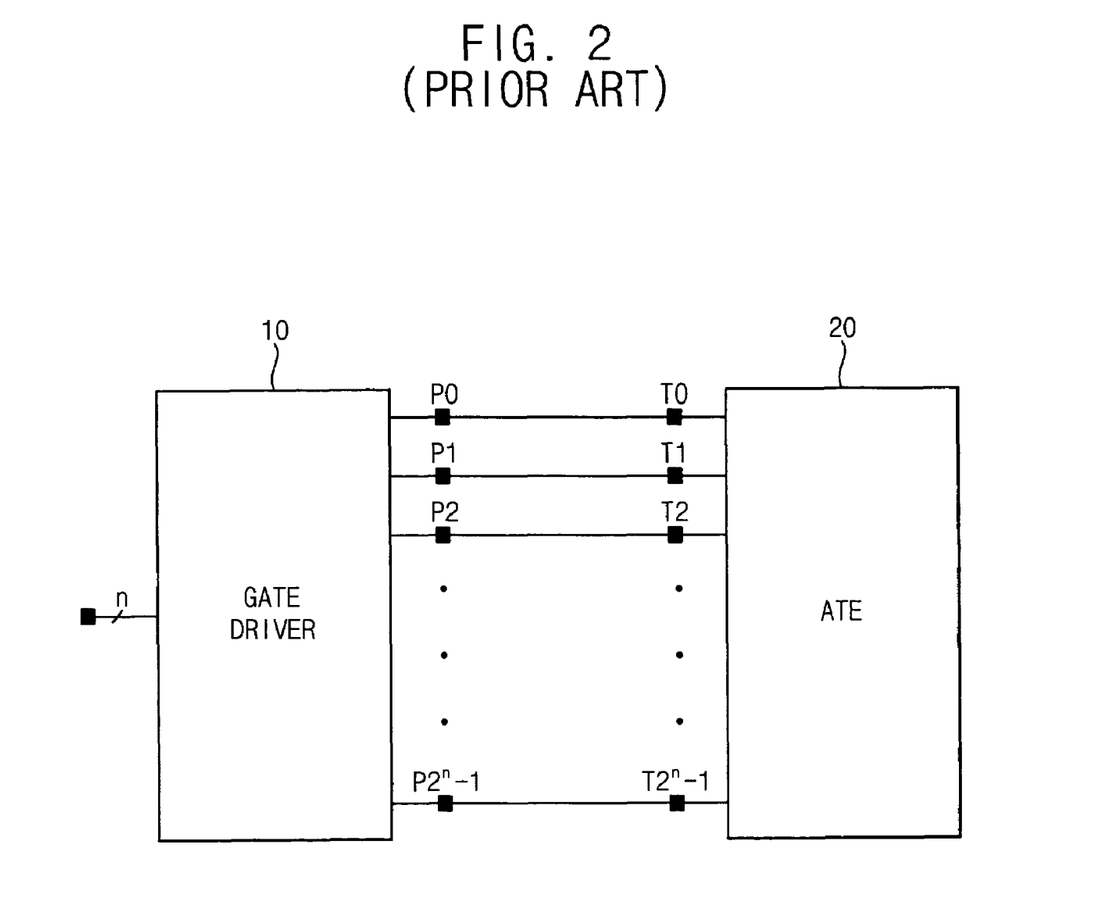
FIG. 2 is a diagram illustrating a relationship of connection between automatic test equipment and a conventional gate driver, as shown in FIG. 1, to be measured by the automatic test equipment.

FIG. 2 is a view illustrating a relationship of connections between an automatic test equipment (ATE) and a conventional gate driver to be measured by the automatic test equipment. Referring to FIG. 2, each of $2^n$ output pins P0 through $P2^n-1$ formed on the gate driver 10 may be respectively connected to each of $2^n$ test terminals T0 through $T2^n-1$ formed in automatic test equipment 20 so that the output signals from the output pins P0 through $P2^n-1$ are measured by the automatic test equipment 20.

Conventionally, as illustrated in FIG. 2, in order to test a driver IC having many output pins, the test equipment may be provided with more test channels than output pins being tested.

However, such multi-channel test equipment may have a problem in that the test equipment may be expensive, because many difficulties may occur during production of the test probe cards.

In practice, a driver integrated circuit used in an LCD for mobile equipment may have 700 to 1,000 output pins. As a result, probe cards for the test equipment may be difficult to manufacture.

In addition, when dual tests to simultaneously test a dual chip are performed, 1,400 to 2,000 test channels may be required. In this case, the probe card in itself may not be manufactured and the aforementioned problems may become more serious.

SUMMARY

According to some embodiments of the present invention, a semiconductor device may include a plurality of output electrodes configured to provide electrical coupling for a respective plurality of output signals outside the semiconductor device. A signal generator may be configured to generate the plurality of output signals. A test circuit may be coupled between the signal generator and the plurality of output electrodes. The test circuit may be configured to couple each of the output signals to a respective one of the output electrodes in a first operating mode, and the test circuit may be configured to sequentially couple each one of the output signals to one of the output electrodes in a second operating mode.

The test circuit may be configured to couple one of the output signals to at least two of the output electrodes in the second operating mode. The signal generator may include a decoder configured to decode data input to generate the plurality of output signals.

The test circuit may include a plurality of signal processing units with each one of the signal processing units coupled between a respective one of the output signals and a respective one of the output electrodes. More particularly, a first one of the signal processing units may include a multiplexer coupled to a respective output signal from the signal generator and coupled to an output signal from a second one of the processing units, and a flip-flop coupled between the multiplexer and the respective output electrode. The multiplexer may be configured to couple the respective output signal from the signal generator as a multiplexer output signal in the first operating mode, and the multiplexer may be configured to couple the output signal from the second signal processing unit as the multiplexer output signal in the second operating mode. The flip-flop may be configured to synchronize the multiplexer output signal with a clock signal and to couple the synchronized multiplexer output signal to the respective output electrode. In addition, the multiplexer may be configured to couple one of the respective output signal from the signal generator and the output signal from the second signal processing unit as the multiplexer output signal responsive to a scan mode test signal stored in a register.

The second signal processing unit may also include a second multiplexer coupled to a second output signal from the signal generator and coupled to an output signal from a third of the processing units, and a second flip-flop coupled between the second multiplexer and a second output electrode. The second multiplexer may be configured to couple the second output signal from the signal generator as a second multiplexer output signal in the first operating mode, and the multiplexer may be configured to couple the second output signal from the third signal processing unit as the second multiplexer output signal in the second operating mode. The second flip-flop may be configured to synchronize the second multiplexer output signal with the clock signal and to provide the synchronized second multiplexer output signal as the output signal of the second signal processing unit.

The test circuit may include a NAND circuit coupled between the output signal of the signal generator and the multiplexer, and the NAND gate may be configured to perform a NAND operation on the output signal of the signal generator and a control signal and to couple a result of the NAND operation to the multiplexer. In addition, a buffer circuit may be coupled between the flip-flop and the output electrode, and the flip-flop may be a D-type flip-flop.

The first operating mode may be a normal operating mode and the second operating mode may be a test mode. Moreover, the signal generator may include a decoder for a gate driver configured to drive a display device.

According to some other embodiments of the present invention, a semiconductor device may include a plurality of output electrodes configured to provide electrical coupling for a respective plurality of output signals outside the semiconductor device. A method of operating such a semiconductor device may include generating a plurality of output signals. In a first operating mode, each of the output signals may be coupled to a respective one of the output electrodes in. In a second operating mode, each one of the output signals may be sequentially coupled to one of the output electrodes.

In the second operating mode, one of the output signals may be coupled to at least two of the output electrodes in the second operating mode. Moreover, generating the plurality of output signals may include decoding data input to generate the plurality of output signals. In addition, generating the plurality of output signals may include decoding signals for a gate driver configured to drive a display device. A digital code value may be set in an external register, with different digital code values being used to select the first and second operating modes. In the second operating mode, each one of the output signals sequentially coupled to the one of the output electrodes may be measured.

According to still other embodiments of the present invention, a semiconductor device may include a plurality of outputs configured to provide electrical coupling for a respective plurality of output signals outside the semiconductor device. A signal generator may be configured to generate the plurality of output signals, and a test circuit may be coupled between the signal generator and the plurality of outputs. The test circuit may be configured to couple each one of the output signals to a respective one of the outputs in a first operating mode, and the test circuit may be configured to couple one of the output signals to at least two of the outputs in a second operating mode.

In addition, the test circuit may be configured to sequentially couple each one of the output signals to one of the outputs in the second operating mode. Moreover, the signal generator may include a decoder configured to decode data input to generate the plurality of output signals.

According to some embodiments of the present invention, a semiconductor device with a plurality of output signals may be tested using a single output pin.

According to some other embodiments of the present invention, a method of testing a semiconductor device may be provided wherein a plurality of output signals are tested through a single output pin.

According to some embodiments of the present invention, the semiconductor device may include a plurality of output pins, a decoder and a plurality of signal processing units. The decoder may decode data input from the exterior to output a plurality of signals. The signal processing units may process the output signals of the decoder to provide the processed signals to the corresponding output pins respectively in a normal mode, and may provide each of the output signals to one of the output pins in response to a scan test mode signal provided from the exterior in a test mode. The scan test mode signal may be set to cause the semiconductor device to operate in the test mode and in a normal mode. The signal processing unit, upon the test mode, may provide the output signal to the last pin of the output pins in accordance with the scan test mode signal input from the exterior. The semiconductor device may be a gate driver configured to drive a display device.

According to further embodiments of the present invention, the signal processing unit may include a multiplexer configured to receive a scan test mode signal and to select one of the decoded signals provided from the decoder and the scan mode signal to output the selected signal. A D-type flip-flop may be configured to receive the output signal from the multiplexer and to synchronize the output signal with a clock signal applied from the exterior to provide the synchronized signal to the corresponding output pin. The scan test mode signal may be set in the form of digital code in an external register. The scan signal may be a dummy signal in the first stage's signal processing unit and may be an output signal of the previous stage's signal processing unit in the remaining stage's signal processing units.

According to still further embodiments of the present invention, the multiplexer may select the scan signal to provide the selected signal to the D-type flip-flop when the scan test mode signal is at a logic high level, and may select the decoded signal to provide the selected decoded signal to the D-type flip-flop when the scan test mode signal is at a logic low level.

According to yet further embodiments of the present invention, the signal processing unit may include a NAND gate connected between the decoder and the multiplexer, and configured to perform a logical NAND operation of the output signal from the decoder and a control signal from the exterior and to provide the resultant signal to the multiplexer. In addition, a buffer may be provided between the D-type flip-flop and the output pin.

The scan test mode signal may be set in the form of digital code in an external register. In addition, the scan test mode signal may be used to set the semiconductor device to alternatively operate in the test mode or in the normal mode. The scan signal of the signal processing unit of the first stage may be a dummy signal, and the scan signal of the signal processing units of the other stages excepting for the first stage may be an output signal of the signal processing unit of the previous stage.

According to some other embodiments of the present invention, the semiconductor device may include n output pins, a decoder configured to decode input data provided from the exterior to output the n decoded signals, and n signal processing units configured to process the decoded signals provided from the decoder to provide the processed signals to the corresponding output pins in a normal mode. A serial path may be formed among the signal processing units in a test mode so that the output signals of the signal processing units may be provided to any one of the n output pins in response to a scan test mode signal.

In further embodiments of the present invention, one pin may correspond to an n-th output pin. The output signals of the first to n-th output signal processing unit, upon the test mode, may be output sequentially through the n-th output pin.

In still further embodiments, the signal processing unit may include a multiplexer configured to receive a scan test mode signal and to select one of the decoded signals provided from the decoder and the scan mode signal to output the selected signal. The signal processing unit may also include a D-type flip-flop configured to receive the output signal from the multiplexer and to synchronize the output signal with a clock signal applied from the exterior to provide the synchronized signal to the corresponding output pin.

The multiplexer may select the scan signal to provide the selected signal to the D-type flip-flop when the scan test mode signal is at a logic high level, and to select the decoded signal to provide the selected decoded signal to the D-type flip-flop when the scan test mode signal is at a logic low level.

According to additional embodiments of the present invention, the signal processing unit may further include a NAND gate connected between the decoder and the multiplexer, and configured to perform a logical NAND operation of the output signal from the decoder and a control signal from the exterior to provide the resultant signal to the multiplexer. Furthermore, a buffer may be coupled between the D-type flip-flop and the output pin.

According to some embodiments of the present invention, a method of testing a semiconductor device may include predetermining any one of a plurality of output pins formed in the semiconductor device as a test pin to connect the test pin to external test equipment in a test mode. A scan test mode signal may be received from the exterior to select an output signal to be output to the test pin in the test mode. The output signals may be output through the test pin in response to the received scan test mode signal in the test mode in which the output signals are the signals to be respectively output to the output pins in a normal mode.

Beginning with a first output signal that is output through the first output pin in the normal mode, the output signals may be sequentially output through the test pin. The semiconductor device may include a plurality of signal processing units configured to respectively process the output signals, and each of the signal processing units may include a multiplexer configured to receive the scan test mode signal to select the output signal.

According to further embodiments of the present invention, the method may include setting a digital code value in an external register where the digital code value is used to generate the scan test mode signal. In addition, the method may include measuring the output signals output through the test pin using the external test equipment.

DETAILED DESCRIPTION OF THE EXAMPLE EMBODIMENTS

The present invention now will be described more fully hereinafter with reference to the accompanying drawings, in which illustrative embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art. Common reference numerals have been used, where possible, to designate elements that are common to different figures.

It will be understood that when an element is referred to as being "coupled", "connected" or "responsive" to another element, it can be directly coupled, connected or responsive to the other element or intervening elements may also be present. In contrast, when an element is referred to as being "directly coupled", "directly connected" or "directly responsive" to another element, there are no intervening elements present. As used herein the term "and/or" includes any and all combinations of one or more of the associated listed items and may be abbreviated by "/". Moreover, each embodiment described and illustrated herein includes its complementary conductivity type embodiment as well.

It will also be understood that, although the terms first, second, etc. may be used herein to describe various elements, these elements should not be limited by these terms. These terms are only used to distinguish one element from another element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
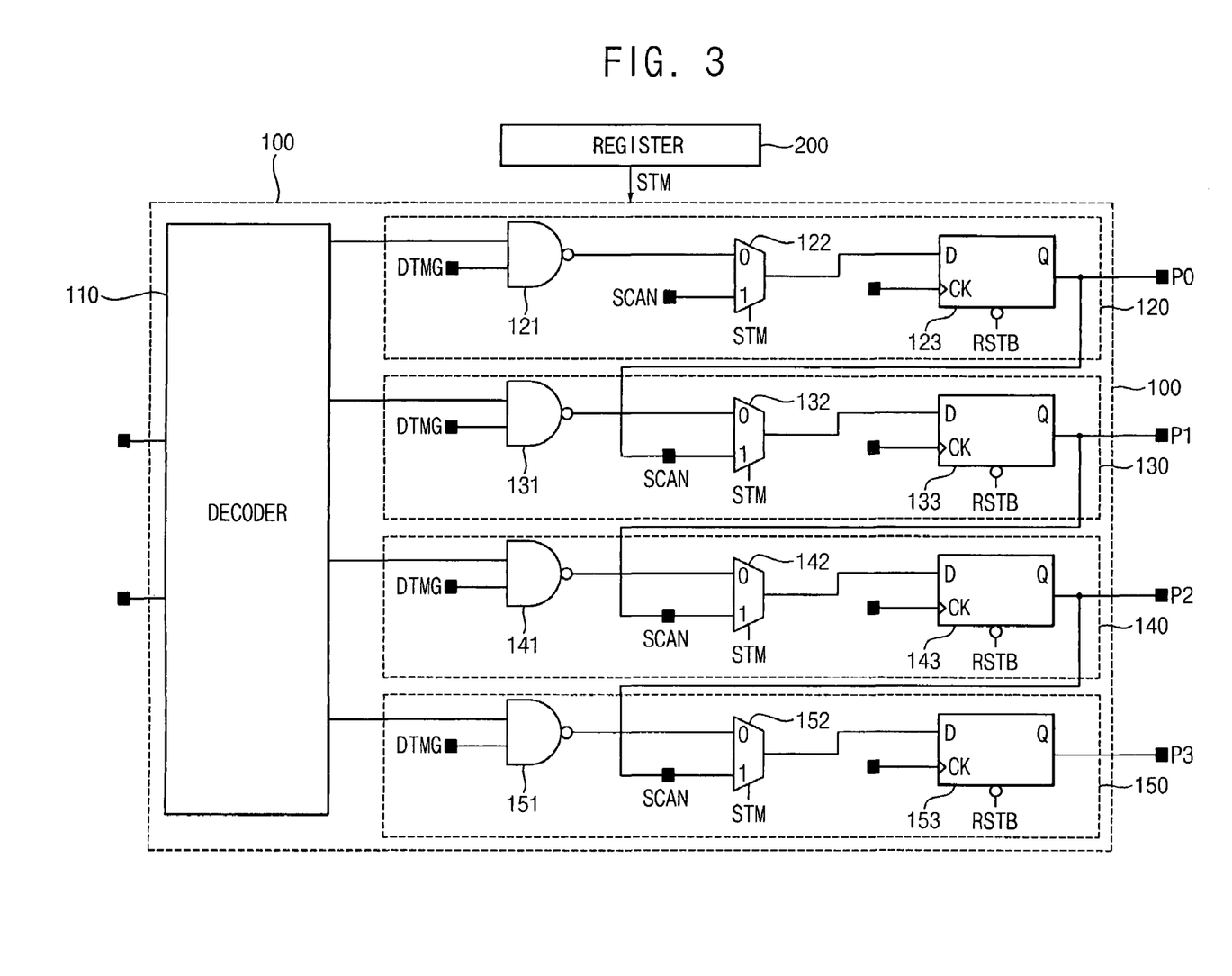
FIG. 3 is a circuit diagram illustrating a configuration of a semiconductor device according to embodiments of the present invention.

FIG. 3 is a circuit diagram illustrating a configuration of a semiconductor device according to embodiments of the present invention, a gate driver of which receives 2-bits of data and provides four gate signals. Referring to FIG. 3, the gate driver 100 includes a decoder 110; a plurality of signal processing units 120, 130, 140 and 150 corresponding to outputs of the decoder 110; and a plurality of output pins P0, P1, P2 and P3 configured to provide output signals of the signal processing units 120, 130, 140 and 150.

The decoder 110 decodes input data received from outside the gate driver 100 to provide the decoded data. When 2-bits of input data are provided, for example, the decoded output data may include $2^2$ (=4) signals. Namely, a first decoded signal, a second decoded signal, a third decoded signal and a fourth decoded signal may be provided.

Then, the gate driver 100 may include four signal processing units, namely, the first signal processing unit 120, the second signal processing unit 130, the third signal processing unit 140, and the fourth signal processing unit 150. The four signal processing units may be included to respectively process the first decoded signal, the second decoded signal, the third decoded signal and the fourth decoded signal, which are output from the decoder 110.

Furthermore, each of outputs from the first, second, third, and fourth signal processing units 120, 130, 140 and 150, in a normal test mode, may be provided to each of the first, second, third, and fourth output pins. Also, buffers (not shown) used to buffer the output signals may be included between the signal processing units 120, 130, 140 and 150 and the output pins P0, P1, P2, and P3. The signal processing units 120, 130, 140, and 150 may include NAND gates 121, 131, 141, and 151 coupled to outputs of the decoder 110; multiplexers 122, 132, 142 and 152 coupled to outputs of the NAND gates 121, 131, 141 and 151; and D-type flip-flops 123, 133, 143 and 153 coupled to the multiplexers 122, 132, 142 and 152, respectively.

Each of the NAND gates 121, 131, 141 and 151 may receive the decoded signal output from the decoder 110 and a control signal DTMG provided from the exterior to perform the NAND operation thereof, thereby performing the function of controlling outputs of the NAND gates. The control signal DTMG may be a signal applied from the exterior, such as a timing controller. That is, the control signal DTMG may reduce and/or prevent unnecessarily outputting a signal when the gate driver 100 is in a standby state, and may also be referred to as an output enable signal of the decoded signal.

Each of multiplexers 122, 132, 142, and 152 may select either a corresponding output signal of the NAND gates 121, 131, 141 and 151 or a scan signal SCAN to output the selected signal, according to a scan test mode signal STM applied from the exterior.

The scan signal SCAN corresponds to the output signal from the signal processing unit previous to the corresponding stage. That is, the scan signal SCAN of the second multiplexer 132 may be the output signal from the first D-type flip-flop 123, the scan signal SCAN of the third multiplexer 142 may be the output signal from the second D-type flip-flop 133, and the scan signal SCAN of the fourth multiplexer 152 may be the output signal from the third D-type flip-flop 143.

Accordingly, an output terminal of the first D-type flip-flop 123 may be coupled to a scan signal input terminal of the second multiplexer 132, an output terminal of the second D-type flip-flop 133 may be coupled to a scan signal input terminal of the third multiplexer 142, and an output terminal of the third D-type flip-flop 143 may be coupled to a scan signal input terminal of the fourth multiplexer 152. Because there is no signal processing unit previous to the first multiplexer 122, a dummy signal may be applied to the scan signal input terminal and/or the first multiplexer 122 may be excluded.

By such a relationship of connection, the output signals from signal processing units 120, 130, 140, and 150 may be transferred through a serial path to the fourth output pin P3, which is a test pin. Accordingly, the output signals from the first, second and third signal processing units 120, 130 and 140 (that are to be provided to the first, second and third output pins P0, P1 and P2 respectively) may be provided to the fourth output pin P3 which may serve as the test pin.

The signal provided to the fourth output pin P3 may be determined according to the scan test mode signals STMs applied to each of multiplexers 122, 132, 142 and 152.

The scan test mode signal STM is a signal that may control the signal selection of each of multiplexers 122, 132, 142, and 152, and the scan test mode signal STM may have a digital code value capable of being set through an exterior register 200. According to these embodiments of the present invention, a number of the output signals may be 4 because 4 bits may be required.

For example, when a digital code value of '0111' is set in the register 200 so that the scan test mode signals provided to the first multiplexer 122, the second multiplexer 132, the third multiplexer 142, and the fourth multiplexer 152 are '0', '1', '1' and '1', respectively, the first output signal may be provided to the fourth output pin P3 by using the 4-bit digital code set in the register 200. Likewise, when the digital code value '1011' is set in the register 200, the second output signal may be provided to the fourth output pin P3. A more detailed description of operations of the gate driver is provided below.

The D-type flip-flops 123, 133, 143, and 153 provide the output signals from the multiplexers 122, 132, 142 and 152 at the output pins P0, P1, P2 and P3, respectively, in response to a clock signal CK applied from an external timing controller (not shown). A signal stored in the D-type flip-flop 123, 133, 143, and 153 may be cleared by a reset signal RSTB.

As discussed above, the output terminal of the first D-type flip-flop 123 may be coupled to the scan signal input terminal of the second multiplexer 132, the output terminal of the second D-type flip-flop 133 may be coupled to the scan signal input terminal of the third multiplexer 142, and the output terminal of the third D-type flip-flop 143 may be coupled to the scan signal input terminal of the fourth multiplexer 152. By the configuration described above, each output signal of the signal processing units 120, 130, 140 and 150 may be provided to the fourth output pin P3 (which is the last output pin). Therefore, when only the fourth output pin P3 is used for a test, all of the output pins P0, P1, P2 and P3 may be tested.

Figure 4:
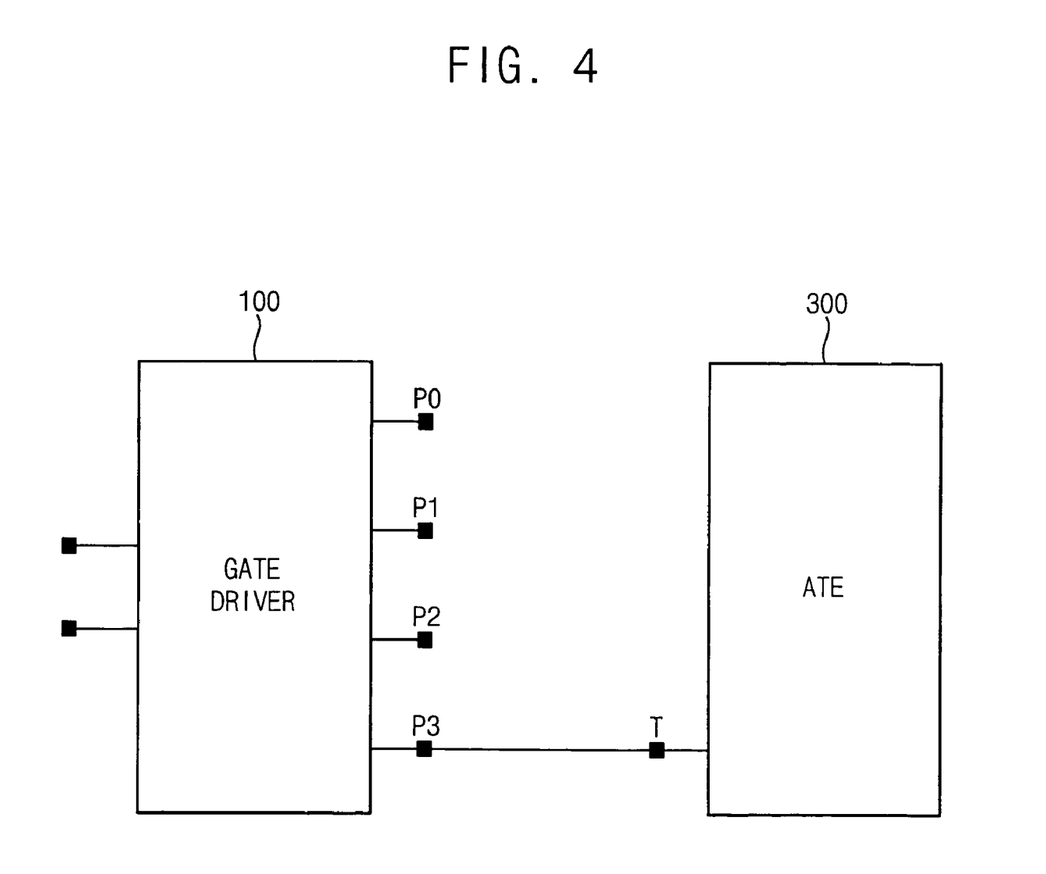
FIG. 4 is a diagram illustrating a connection relationship between automatic test equipment and a gate driver, as shown in FIG. 3, used to test the gate driver, according to embodiments of the present invention.
Figure 5:
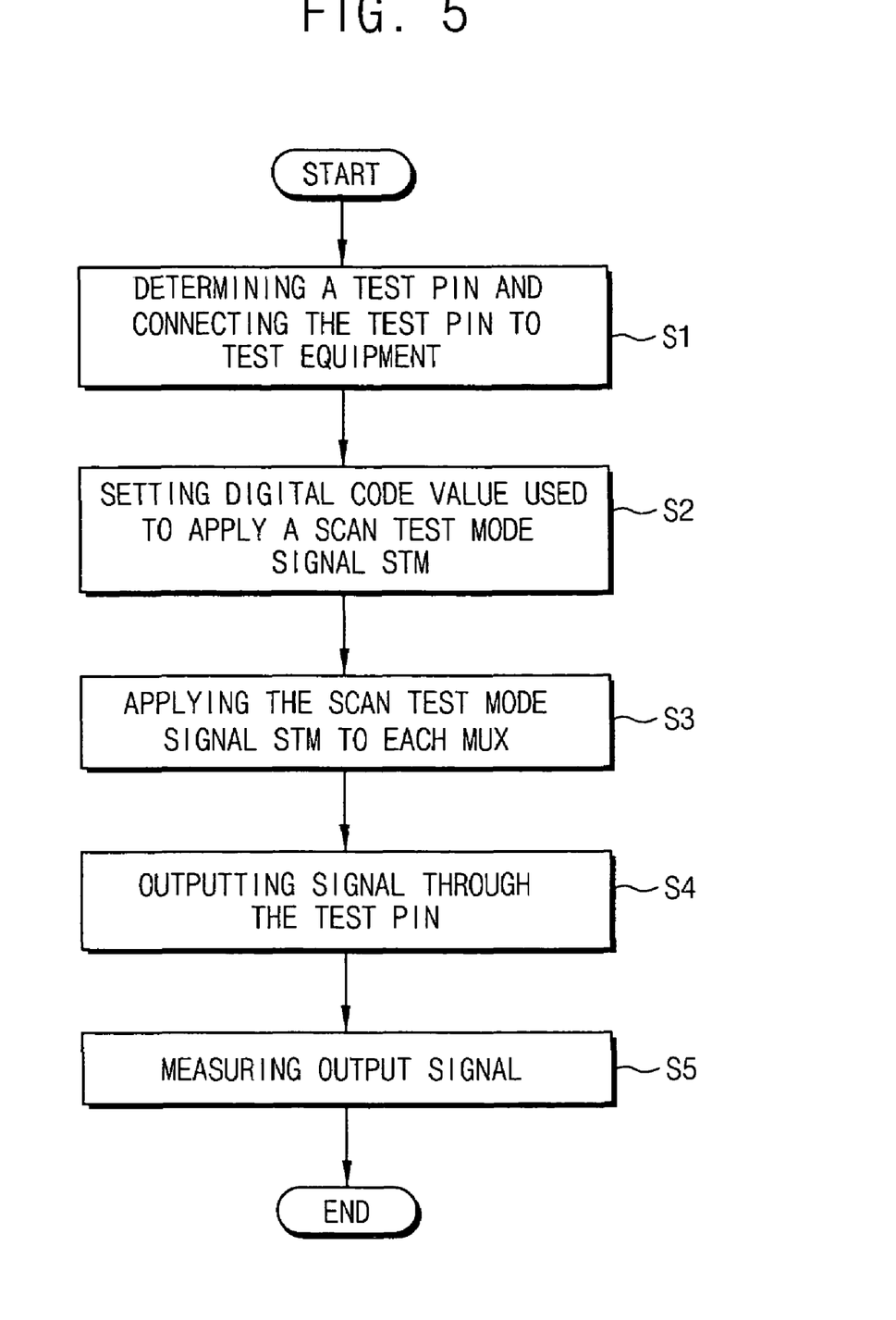
FIG. 5 is a flowchart illustrating methods used to test gate drivers according to embodiments of the present invention.

Operations of the gate driver 100 will become more apparent by further description as follows. FIG. 4 is a diagram illustrating a relationship of connection between automatic test equipment and the gate driver, as shown in FIG. 3, used to test the gate driver. FIG. 5 is a flowchart illustrating a method used to test a gate driver according to embodiments of the present invention.

A method of testing the gate driver 100 will be described with reference to FIG. 3 through FIG. 5. As discussed above, the fourth output pin P3 (which is the last pin of the gate driver 100), outputs all of the first, second, third and fourth output signals. Therefore, in step S1, the fourth output pin P3 is determined as the test pin so that the fourth output pin P3 may be coupled to a test terminal T of automatic test equipment 300 as shown in FIG. 4. Also, in step S2, a digital code value, capable of outputting the first, second, third and fourth output signals, is set in the external register 200. By way of example, a case in which the digital code values are set to be '0111', '1011', '1101' and '1110' is discussed. Then, the most significant bit (MSB) of the digital code may be applied as the scan test mode signal STM to the first multiplexer 122, the second-highest order bit may be applied as the scan test mode signal STM to the second multiplexer 132, the third-highest order bit may be applied as the scan test mode signal STM to the third multiplexer 142, and the least significant bit may be applied as the scan test mode signal STM to the fourth multiplexer 152.

Upon completion of the connection used to test and the digital code setting, the scan test mode signal STM (based on the digital code value) may be sequentially provided to each of the multiplexers 122, 132, 142 and 152 in step S3, and thereafter, when each output from the D-type flip-flops 123, 133 and 143 is output sequentially through the fourth output pin P3 (which is the test pin) in step S4, and the outputs are measured through the automatic test equipment 300 in step S5.

First, when the digital code value '0111' is input, the first multiplexer 122 selects the first decoded signal among the first decoded signal and a dummy signal to provide the selected first decoded signal to the first D-type flip-flop 123. The first D-type flip-flop 123 synchronizes the received signal from the first multiplexer 122 with the clock signal CK to output the synchronized signal to the first output pin P0.

Because the first output pin P0 is open, however, the output signal from the first D-type flip-flop 123 may be provided as the scan signal SCAN to the second multiplexer 132. Then, because the scan test mode signal STM received by the second multiplexer 132 is '1', the second multiplexer 132 provides the output signal of the first D-type flip-flop 123, received as the scan signal SCAN, to the second D-type flip-flop 133.

Here, the scan test mode signals STM input to the third multiplexer 142 and the fourth multiplexer 152 are '1' (like that which is input in the second multiplexer 132). Accordingly, the output signal from the first D-type flip-flop 123 is provided through the second D-type flip-flop 133, through the third D-type flip-flop 143, and through the fourth D-type flip-flop 153 to the fourth output pin P3.

Accordingly, the automatic test equipment 300 may measure the first output signal, which is the output signal from the first D-type flip-flop 123.

When the digital code value '1011' is input as STM signals, the first multiplexer 122 selects the dummy signal among the first decoded signal and the dummy signal to provide the selected dummy signal to the first D-type flip-flop 123. The first D-type flip-flop 123 synchronizes the received signal from the first multiplexer 122 with the clock signal CK to output the synchronized signal to the first output pin P0.

Because the first output pin P0 is open, however, the output signal of the first D-type flip-flop 123 is input as the scan signal SCAN of the second multiplexer 132. Because the scan test mode signal STM input in the second multiplexer 132 is '0', the second multiplexer 132 provides the second decoded signal from the decoder 110 to the second D-type flip-flop 133.

Also, the second D-type flip-flop 133 synchronizes the second decoded signal received from the second multiplexer 132 with the clock signal CK to output the synchronized signal to the second output pin P1. Because the second output pin P1 is open, however, the output signal from the second D-type flip-flop 133 is input as the scan signal SCAN of the third multiplexer 142.

Because the scan test mode signal STM of the third multiplexer 142 is '1', the third multiplexer 142 selects the second decoded signal input as the scan signal SCAN to provide the selected second decoded signal to the third D-type flip-flop 143. Accordingly, the output of the third D-type flip-flop 143 is provided as the scan signal SCAN to the fourth multiplexer 152 and the scan test mode signal STM of the fourth multiplexer 152 is '1'. Therefore, the output signal of the second D-type flip-flop 133 is provided through the third D-type flip-flop 143, through the fourth D-type flip-flop 153, and through the fourth output pin P3 to the automatic test equipment 300. Accordingly, the test equipment 300 may measure the second output signal, which is the output signal of the second D-type flip-flop 133.

Subsequently, when the digital code value '1101' is input as STM signals, '0' is input as the scan test mode signal STM in the third multiplexer 142. Therefore, regardless of the scan signal SCAN provided previously, the third multiplexer 142 selects the third decoded signal from the decoder 110 to provide the selected signal to the third D-type flip-flop 143.

The third D-type flip-flop 143 synchronizes the third decoded signal with the clock signal CK to output the synchronized signal to the third output pin P2. Because the third output pin P2 is open, however, the output signal of the third D-type flip-flop 143 is input as the scan signal SCAN of the fourth multiplexer 152.

Because the scan test mode signal STM of the fourth multiplexer 152 is '1', the fourth multiplexer 152 provides the third output signal, which is the scan signal SCAN, to the fourth D-type flip-flop 153, and the third output signal is provided to the fourth output pin P3 by the fourth D-type flip-flop 153. Accordingly, the automatic test equipment 300 may measure the third output signal, which is the output signal of the third D-type flip-flop 143.

When the digital code value '1110' is input, '0' is provided as the scan test mode signal STM to the fourth multiplexer 152. Therefore, regardless of the scan signal SCAN provided previously, the fourth multiplexer 152 selects the fourth decoded signal from the decoder 110 to provide the selected signal to fourth D-type flip-flop 153.

The fourth D-type flip-flop 153 synchronizes the fourth decoded signal with the clock signal CK to output the synchronized signal to the fourth output pin P3. Then, the synchronized signal is provided to the test equipment 300 connected to the fourth output pin P3. Accordingly, the test equipment 300 may measure the fourth output signal, which is the output signal of the fourth D-type flip-flop 153.

Thus, when the digital code values '0111', '1011', '1101' and '1110' are set in the external register 200, and each corresponding bit is provided as the scan test mode signal STM to the respective multiplexers 122, 132, 142 and 152, the first output signal provided to the first output pin P0, the second output signal provided to the second output pin P1, the third output signal provided to the third output pin P2 and the fourth output signal provided to the fourth output pin P3 may be sequentially transmitted through the fourth output pin P3 to the automatic test equipment 300. Accordingly, output signals of all of the output pins P0, P1, P2 and P3 may be measured by connecting a single channel to one test terminal T as shown in FIG. 4.

In addition, when all of the scan mode signals STM provided to the multiplexers 122, 132, 142 and 152 are set to be '0', the test mode may be disabled. The reason is that when all of the scan test mode signals STM are '0', (i.e. the digital code value is '0000'), each of the multiplexers 122, 132, 142 and 152 selects the respective output from the decoder 110. In this case, the test mode is not set, but a normal mode, which is a normal driving mode, is set. Accordingly, the scan test mode signal STM may be used to determine an operation mode of the gate driver 100. The gate driver 100 may be alternatively operated in the test mode or in the normal mode, based on the scan test mode signal STM.

As described above, because the test of the gate driver may be performed regardless of the number of the output pins thereof, a gate driver having $2^n$ output pins may be tested using a single test pin as discussed above.

Figure 6:
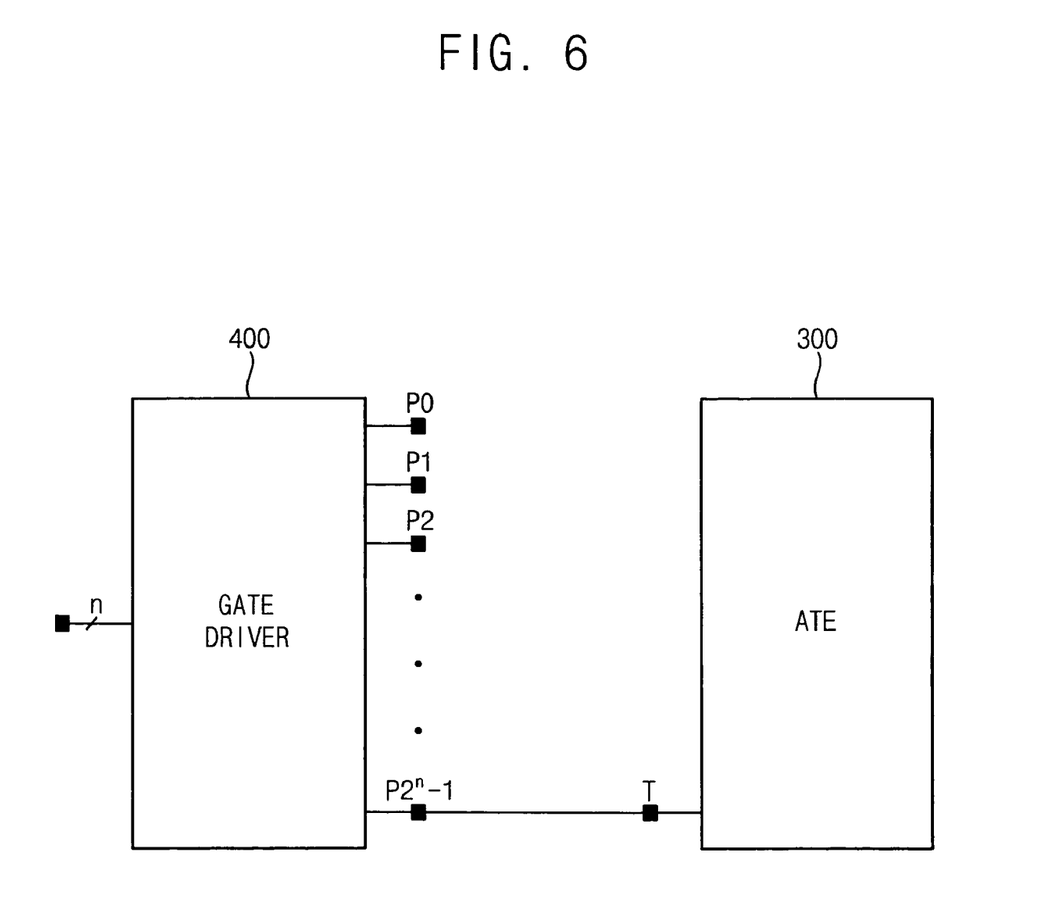
FIG. 6 is a diagram illustrating a relationship of connection between automatic test equipment and a gate driver having $2^n$ output pins, used to test the gate driver, according to embodiments of the present invention.

FIG. 6 is a diagram illustrating a relationship of connection between automatic test equipment and a gate driver having $2^n$ output pins used to test the gate driver, according to embodiments of the present invention.

Referring to FIG. 6, it will be understood that a $(2^n-1)$th output pin P$2^n$-1 (which is the last output pin of a gate driver 400), may be configured to be a test pin, and the output pin P$2^n$-1 may be connected to automatic test equipment 300. Even though a gate driver according to embodiments of the present invention may have a large number of output pins, the gate driver may be easily measured by the test equipment having only a single channel regardless of the number of the output pins.

As described above, using semiconductor devices and methods of testing thereof according to some embodiments of the present invention, output signals of the semiconductor device may be tested using a single test pin regardless of the number of output pins of the semiconductor device. Accordingly, the present invention may reduce a need for expensive test equipment having a greater number of channels than output pins and/or production of the test equipment may be facilitated.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A semiconductor device comprising:
   a plurality of output electrodes configured to provide electrical coupling for a respective plurality of output signals outside the semiconductor device;
   a signal generator configured to generate the plurality of output signals; and
   a test circuit coupled between the signal generator and the plurality of output electrodes, wherein the test circuit is configured to couple each of the output signals to a respective one of the output electrodes in a first operating mode, and wherein the test circuit is configured to sequentially couple each one of the output signals to one of the output electrodes in a second operating mode.

2. A semiconductor device according to claim 1 wherein the test circuit is configured to couple one of the output signals to at least two of the output electrodes in the second operating mode.

3. A semiconductor device according to claim 1 wherein the signal generator comprises a decoder configured to decode data input to generate the plurality of output signals.

4. A semiconductor device according to claim 1 wherein the test circuit comprises a plurality of signal processing units with each one of the signal processing units coupled between a respective one of the output signals and a respective one of the output electrodes, a first one of the signal processing units comprising:
   a multiplexer coupled to a respective output signal from the signal generator and coupled to an output signal from a second one of the processing units, wherein the multiplexer is configured to couple the respective output signal from the signal generator as a multiplexer output signal in the first operating mode, and wherein the multiplexer is configured to couple the output signal from the second signal processing unit as the multiplexer output signal in the second operating mode; and
   a flip-flop coupled between the multiplexer and the respective output electrode wherein the flip-flop is configured to synchronize the multiplexer output signal with a clock signal and to couple the synchronized multiplexer output signal to the respective output electrode.

5. A semiconductor device according to claim 4 wherein the multiplexer is configured to couple one of the respective output signal from the signal generator and the output signal from the second signal processing unit as the multiplexer output signal responsive to a scan mode test signal stored in a register.

6. A semiconductor device according to claim 4 wherein the second signal processing unit comprises:
   a second multiplexer coupled to a second output signal from the signal generator and coupled to an output signal from a third of the processing units, wherein the second multiplexer is configured to couple the second output signal from the signal generator as a second multiplexer output signal in the first operating mode, and wherein the multiplexer is configured to couple the second output signal from the third signal processing unit as the second multiplexer output signal in the second operating mode; and
   a second flip-flop coupled between the second multiplexer and a second output electrode wherein the second flip-flop is configured to synchronize the second multiplexer output signal with the clock signal and to provide the synchronized second multiplexer output signal as the output signal of the second signal processing unit.

7. A semiconductor device according to claim 4 wherein the test circuit includes a NAND circuit coupled between the output signal of the signal generator and the multiplexer, wherein the NAND gate is configured to perform a NAND operation on the output signal of the signal generator and a control signal and to couple a result of the NAND operation to the multiplexer.

8. A semiconductor device according to claim 4 further comprising:
   a buffer circuit coupled between the flip-flop and the output electrode.

9. A semiconductor device according to claim 4 wherein the flip-flop comprises a D-type flip-flop.

10. A semiconductor device according to claim 1 wherein the first operating mode comprises a normal operating mode and the second operating mode comprises a test mode.

11. A semiconductor device according to claim 1 wherein the signal generator comprises a decoder for a gate driver configured to drive a display device.

12. A method of operating a semiconductor device including a plurality of output electrodes configured to provide electrical coupling for a respective plurality of output signals outside the semiconductor device, the method comprising:

generating a plurality of output signals;

in a first operating mode, coupling each of the output signals to a respective one of the output electrodes; and in a second operating mode, sequentially coupling each one of the output signals to one of the output electrodes.

13. A method according to claim 12 further comprising coupling one of the output signals to at least two of the output electrodes in the second operating mode.

14. A method according to claim 12 wherein generating the plurality of output signals comprises decoding data input to generate the plurality of output signals.

15. A method according to claim 12 wherein generating the plurality of output signals comprises decoding signals for a gate driver configured to drive a display device.

16. A method according to claim 12 further comprising:

setting a digital code value in an external register, with different digital code values being used to select the first and second operating modes.

17. A method according to claim 12 further comprising:

in the second operating mode, measuring each one of the output signals sequentially coupled to the one of the output electrodes.

18. A semiconductor device comprising:

a plurality of outputs configured to provide electrical coupling for a respective plurality of output signals outside the semiconductor device;

a signal generator configured to generate the plurality of output signals; and a test circuit coupled between the signal generator and the plurality of outputs, wherein the test circuit is configured to couple each one of the output signals to a respective one of the outputs in a first operating mode, and wherein the test circuit is configured to couple one of the output signals to at least two of the outputs in a second operating mode.

19. A semiconductor device according to claim 18 wherein the test circuit is configured to sequentially couple each one of the output signals to one of the outputs in the second operating mode.

20. A semiconductor device according to claim 19 wherein the signal generator comprises a decoder configured to decode data input to generate the plurality of output signals.

* * * * *